(12) United States Patent
Harada et al.

(10) Patent No.: US 10,186,979 B2
(45) Date of Patent: Jan. 22, 2019

(54) ELECTRIC POWER CONVERTER

(71) Applicant: DENSO CORPORATION, Kariya, Aichi-pref. (JP)

(72) Inventors: Naohisa Harada, Kariya (JP); Akira Nakasaka, Kariya (JP); Tsuyoshi Kurauchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 19 days.

(21) Appl. No.: 15/137,711

(22) Filed: Apr. 25, 2016

(65) Prior Publication Data

US 2016/0315549 A1      Oct. 27, 2016

(30) Foreign Application Priority Data

Apr. 24, 2015   (JP) .................................. 2015-089725

(51) Int. Cl.
  *H02M 7/00*    (2006.01)
  *H05K 7/14*    (2006.01)
  *H02M 7/5387*  (2007.01)

(52) U.S. Cl.
  CPC .......... *H02M 7/003* (2013.01); *H05K 7/1432* (2013.01); *H02M 7/5387* (2013.01)

(58) Field of Classification Search
  CPC ... H02M 7/003; H02M 7/5387; H05K 7/1432
  See application file for complete search history.

(56) References Cited

U.S. PATENT DOCUMENTS

| | | | | |
|---|---|---|---|---|
| 6,870,253 B1 * | 3/2005 | Ushijima | ............. | H01L 25/115 257/691 |
| 2009/0231811 A1 * | 9/2009 | Tokuyama | ............. | H01L 23/36 361/699 |
| 2012/0006595 A1 | 1/2012 | Tachibana | | |
| 2013/0264891 A1 * | 10/2013 | Sawada | .................. | H02M 3/00 307/147 |
| 2015/0195957 A1 * | 7/2015 | Ohoka | ............... | H05K 7/20927 361/702 |
| 2016/0128216 A1 | 5/2016 | Harada et al. | | |

FOREIGN PATENT DOCUMENTS

| | | | |
|---|---|---|---|
| JP | 2013-046468 A | | 3/2013 |
| JP | 2013-115952 A | | 6/2013 |
| JP | 2013115952 A | * | 6/2013 |

\* cited by examiner

*Primary Examiner* — Jue Zhang
(74) *Attorney, Agent, or Firm* — Oliff PLC

(57) ABSTRACT

An electric power converter includes a semiconductor module and a DC bus bar. The semiconductor module includes a main body portion having a built-in semiconductor element therein and a DC terminal to which a DC voltage is applied projecting from the main body portion. A DC bus bar is connected to the DC terminal. The DC bus bar is disposed such that a thickness direction of the DC bus bar matches a projecting direction of the DC terminal. The penetrating portion penetrating the projecting direction is formed in the DC bus bar. The DC terminal is connected to the DC bus bar in a state where at least a part of the DC terminal is disposed in a position that can be seen from the penetrating portion when viewed from the projection direction. The penetrating portion is formed in a hole shape.

7 Claims, 24 Drawing Sheets

ELECTRIC POWER CONVERTER

CROSS-REFERENCE TO RELATED APPLICATION

This application is based on and claims the benefit of priority from earlier Japanese Patent Application No. 2015-89725 filed Apr. 24, 2015, the description of which is incorporated herein by reference.

TECHNICAL FIELD

The present disclosure relates to an electric power converter that includes a semiconductor module having a built-in semiconductor element therein and a DC bus bar connected to the semiconductor module.

BACKGROUND

As an electric power converter for converting power between DC power and AC power, one including a semiconductor module with a built-in semiconductor element therein and a DC bus bar connected to the semiconductor module has been known (refer to Japanese Patent No. 5263334).

The semiconductor module includes a main body portion with the built-in semiconductor element therein and a DC terminal projecting from the main body portion.

The DC bus bar is connected to this DC terminal.

A penetrating portion penetrating in a thickness direction of the DC bus bar is formed in the DC bus bar.

The DC terminal is welded to the DC bus bar under a condition where the DC terminal is inserted into this penetrating portion, and a side surface of the penetrating portion and a principal surface of the DC terminal are in contact with each other (refer to FIG. 28).

The penetrating portion is formed in a shape in which one side thereof in a width direction that is perpendicular to both a projecting direction of the DC terminal and a thickness direction of the DC terminal is open.

However, there is a possibility that a relatively large inductance that is parasitic to the DC bus bar in the electric power converter occurs.

That is, the penetration portion of the DC bus bar is formed in the shape in which one side in the width direction is open in the electric power converter.

Therefore, no metallic material constituting the DC bus bar exist in this portion of one side in the width direction of the DC terminal, thus the DC bus bar is divided by the penetrating portion.

Therefore, a current path around the DC terminal is limited in the DC bus bar.

Therefore, the number of the current paths in the DC bus bar is small, and there is a possibility that a large parasitic inductance occurs in the DC bus bar.

Accordingly, when the semiconductor element is switched, a possibility can be considered that relatively large surge occurs due to the inductance.

SUMMARY OF THE DISCLOSURE

An embodiment provides an electric power converter that can further reduce a parasitic inductance of a DC bus bar.

An electric power converter in an aspect includes a semiconductor module including a main body portion having a built-in semiconductor element therein and a DC terminal to which a DC voltage is applied, projecting from the main body portion, and a DC bus bar connected to the DC terminal.

The DC bus bar is disposed such that a thickness direction of the DC bus bar matches a projecting direction of the DC terminal. A penetrating portion penetrating in the projecting direction is formed in the DC bus bar.

The DC bus bar and the DC terminal are connected to each other in a position where the DC bus bar and the DC terminal overlap with an inner surface of the penetrating portion when viewed from the projecting direction, and the penetrating portion is formed in a hole shape.

In the electric power converter, the DC bus bar and the DC terminal are connected to each other in a position where the DC bus bar and the DC terminal overlap with an inner surface of the penetrating portion when viewed from the projecting direction.

Then, the penetrating portion is formed in the hole shape.

That is, it is configured that surroundings of the penetrating portion are surrounded by a metallic material constituting the DC bus bar.

In this way, a portion of the DC terminal to be connected to the DC bus bar will be surrounded by the metallic material constituting the DC bus bar.

Therefore, a current is hardly limited in a vicinity of the portion mentioned above, and it is possible to increase the number of paths where the current flows in the DC bus bar.

Therefore, it is possible to reduce a parasitic inductance of the DC bus bar.

That is, the parasitic inductance occurs in each of the current paths, and these inductances are connected in parallel to a single DC terminal.

Therefore, the number of parasitic inductances of each current path that are connected in parallel to each other increases when the number of the current paths increases.

As a result, a combined inductance of the plurality of inductances is reduced.

Therefore, when the semiconductor element is switched, a large surge due to the combined inductance can be suppressed from occurring.

As described above, according to the present disclosure, it is possible to provide the electric power converter that can further reduce the parasitic inductance of the DC bus bar.

DETAILED DESCRIPTION OF THE PREFERRED EMBODIMENTS

An electric power converter may be a vehicle-mounted electric power converter for mounting on a vehicle such as a hybrid vehicle or an electric vehicle.

EMBODIMENTS

First Embodiment

An embodiment according to an electric power converter will be described with reference to FIGS. 1 to 17.

Figure 1:
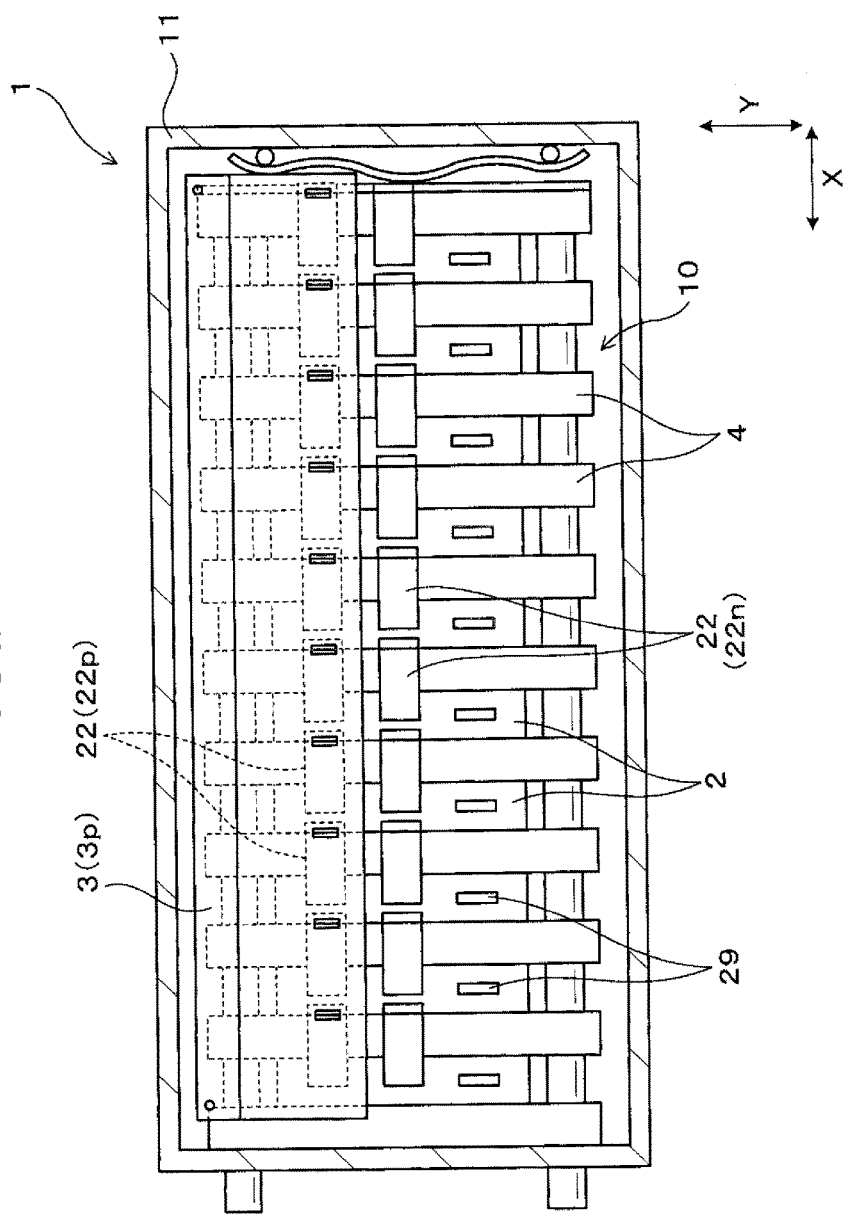
FIG. 1 shows a sectional view of an electric power converter in a state of mounting only one of DC bus bars in a first embodiment.
Figure 4:
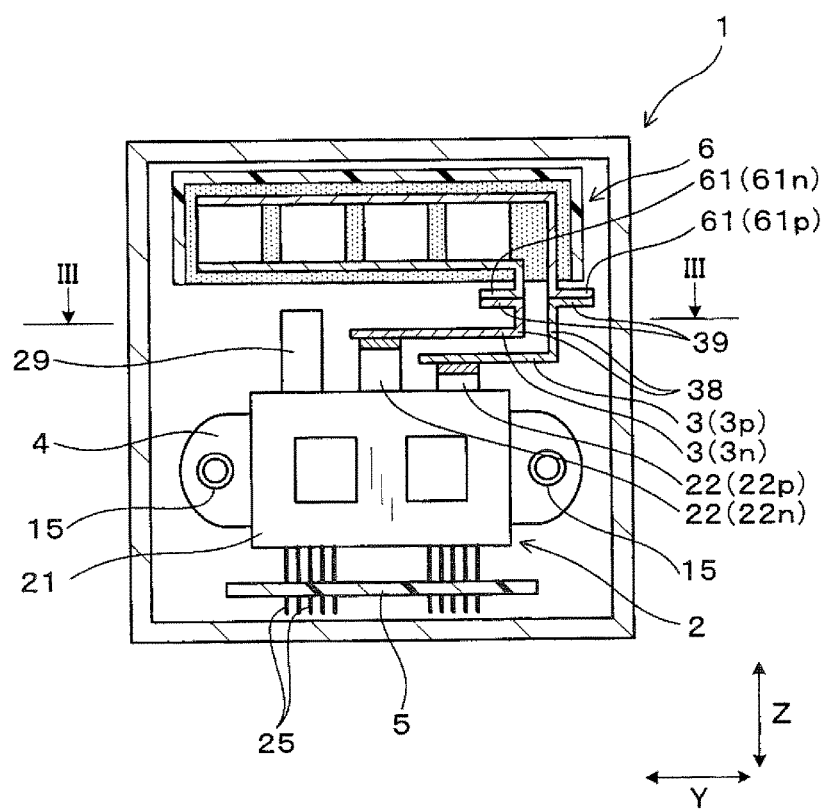
FIG. 4 shows a sectional view taken along a line IV-IV of FIG. 3.

As shown in FIG. 1 and FIG. 4, an electric power converter 1 of the present embodiment includes a semiconductor module 2 and a DC bus bar 3 (3p, 3n).

The semiconductor module 2 includes a main body portion 21 having a built-in semiconductor element 20 (refer to FIG. 16) therein, and a DC terminal 22 (22p, 22n) to which a DC voltage is applied projecting from the main body portion 21.

The DC bus bar 3 is connected to the DC terminal 22.

As shown in FIG. 4, the DC bus bar 3 is disposed such that a thickness direction of the DC bus bar 3 matches a projecting direction (Z direction) of the DC terminal 22.

Figure 2:
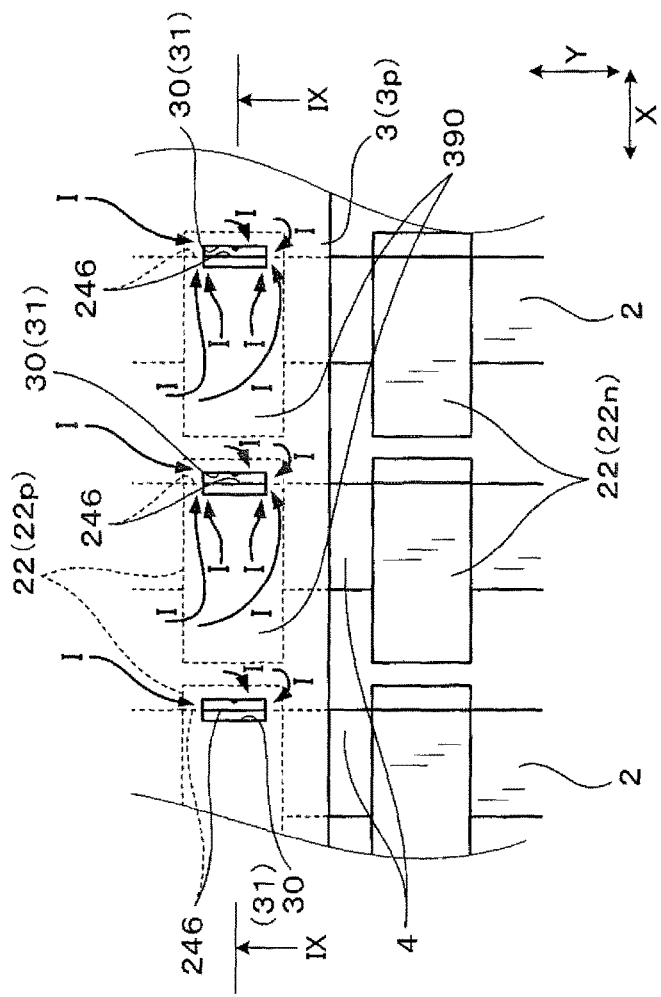
FIG. 2 shows an enlarged view of a principal part of FIG. 1.
Figure 3:
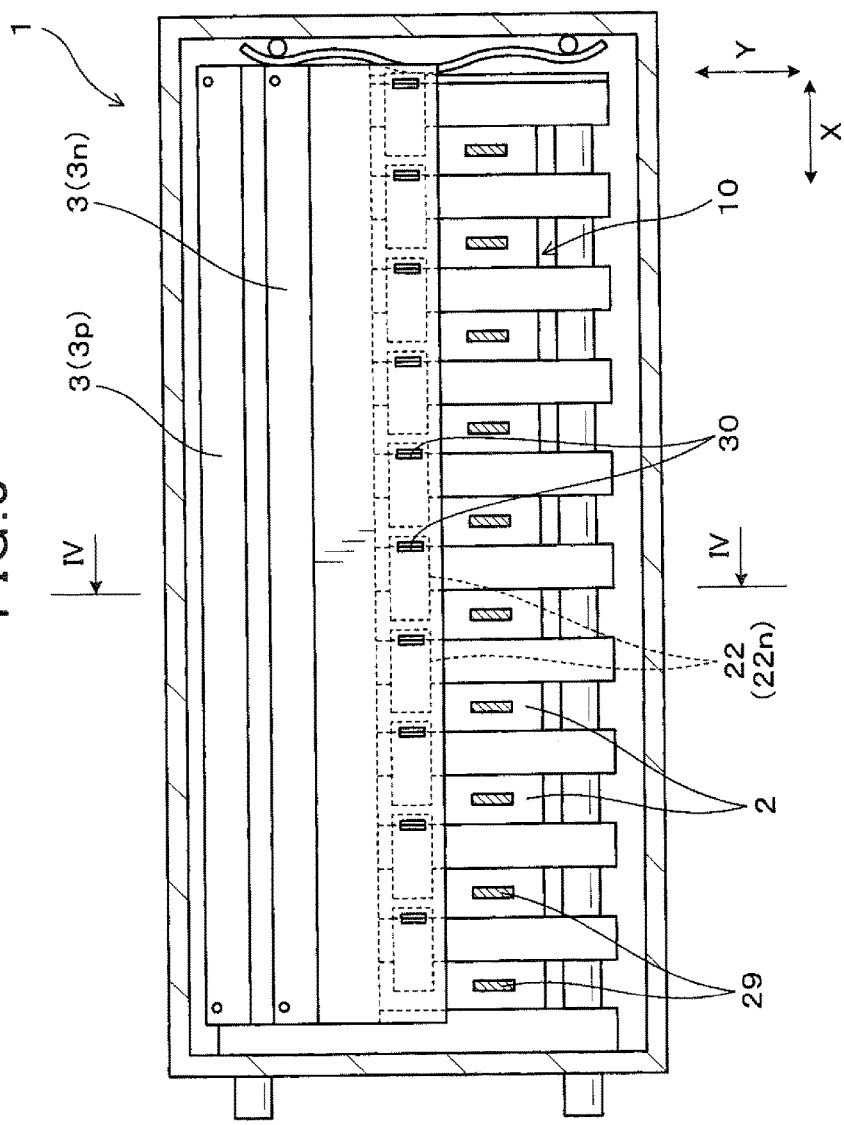
FIG. 3 shows a sectional view of the electric power converter in a state of mounting two DC bus bars, as well as a sectional view taken along a line of FIG. 4 in the first embodiment.

As shown in FIG. 2, a penetrating portion 30 penetrating in the Z direction is formed in the DC bus bar 3.

Figure 9:
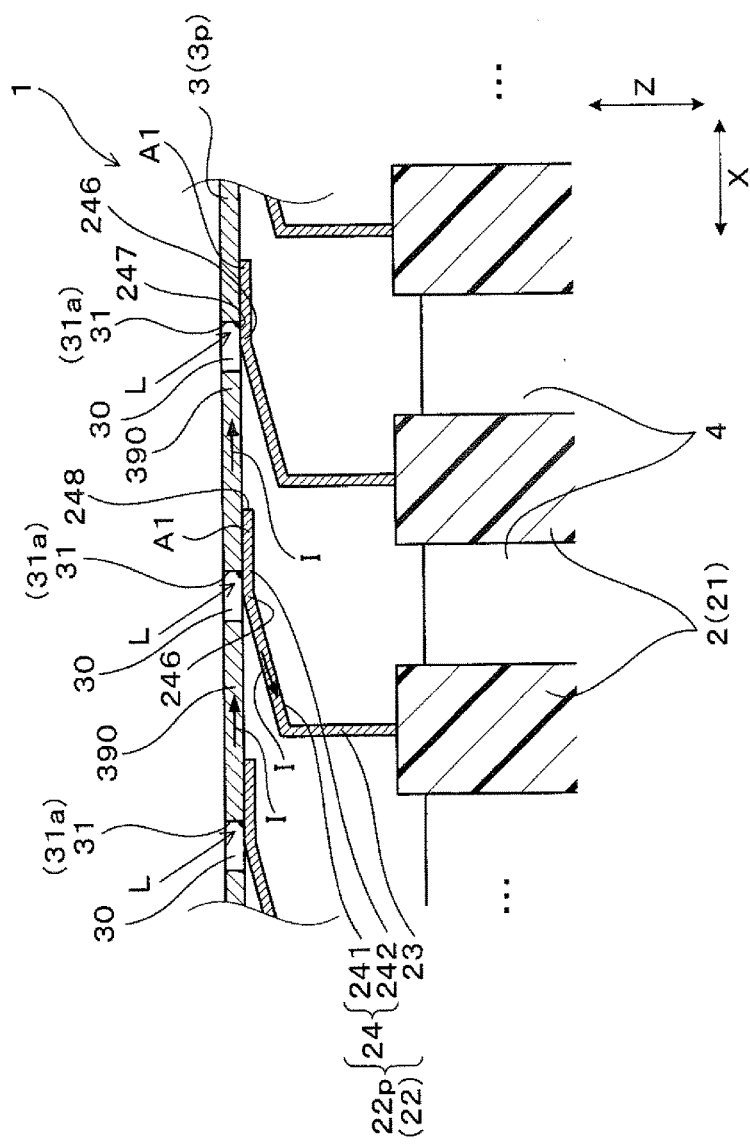
FIG. 9 shows a sectional view of the electric power converter in a state where a positional displacement does not exist between the semiconductor module and the DC bus bar, as well as a sectional view taken along a line IX-IX of FIG. 2 in the first embodiment.

As shown in FIG. 2 and FIG. 9, the DC bus bar 3 and the DC terminal 22 are connected to each other in a position where the DC bus bar 3 and the DC terminal 22 overlap with an inner surface 31 of the penetrating portion 30 when viewed from the Z direction.

In the present embodiment, the DC terminal 22 and the DC bus bar 3 are welded by irradiating a laser beam L to them.

The penetrating portion 30 is formed in a hole shape.

The electric power converter 1 of the present embodiment is a vehicle-mounted electric power converter for mounting on a vehicle such as a hybrid vehicle or an electric vehicle.

As shown in FIG. 1, in the present embodiment, a stacked body 10 is constituted by stacking a plurality of semiconductor modules 2 and a plurality of cooling pipes 4 for cooling the semiconductor modules 2.

As shown in FIG. 9, the semiconductor modules and the cooling pipes 4 are stacked in a thickness direction (X direction) of a terminal body portion 23, which projects from the main body portion 21, of the DC terminal 22.

As shown in FIG. 4, the DC terminals 22 include a positive terminal 22p that is electrically connected to a positive electrode of a DC power source 8 (refer to FIG. 16) and a negative electrode terminal 22n that is electrically connected to a negative electrode of the DC power source 8.

Further, the DC bus bars 3 include a positive bus bar 3p connected to the positive terminal 22p and a negative bus bar 3n connected to the negative terminal 22n.

The DC bus bars 3p, 3n are connected to a capacitor 6.

The DC voltage of the DC power source 8 is smoothened by using the capacitor 6.

Further, the semiconductor module 2 includes an AC terminal 29 and a plurality of control terminals 25.

The control terminals 25 are connected to a control circuit board 5.

A switching operation of the semiconductor module 2 is controlled by using the control circuit board 5.

In addition, an alternating current bus bar (not shown) is connected to the AC terminal 29.

It is configured that the AC terminal 29 is electrically connected to AC loads 81 (refer to FIG. 16) through the AC bus bar.

Figure 16:
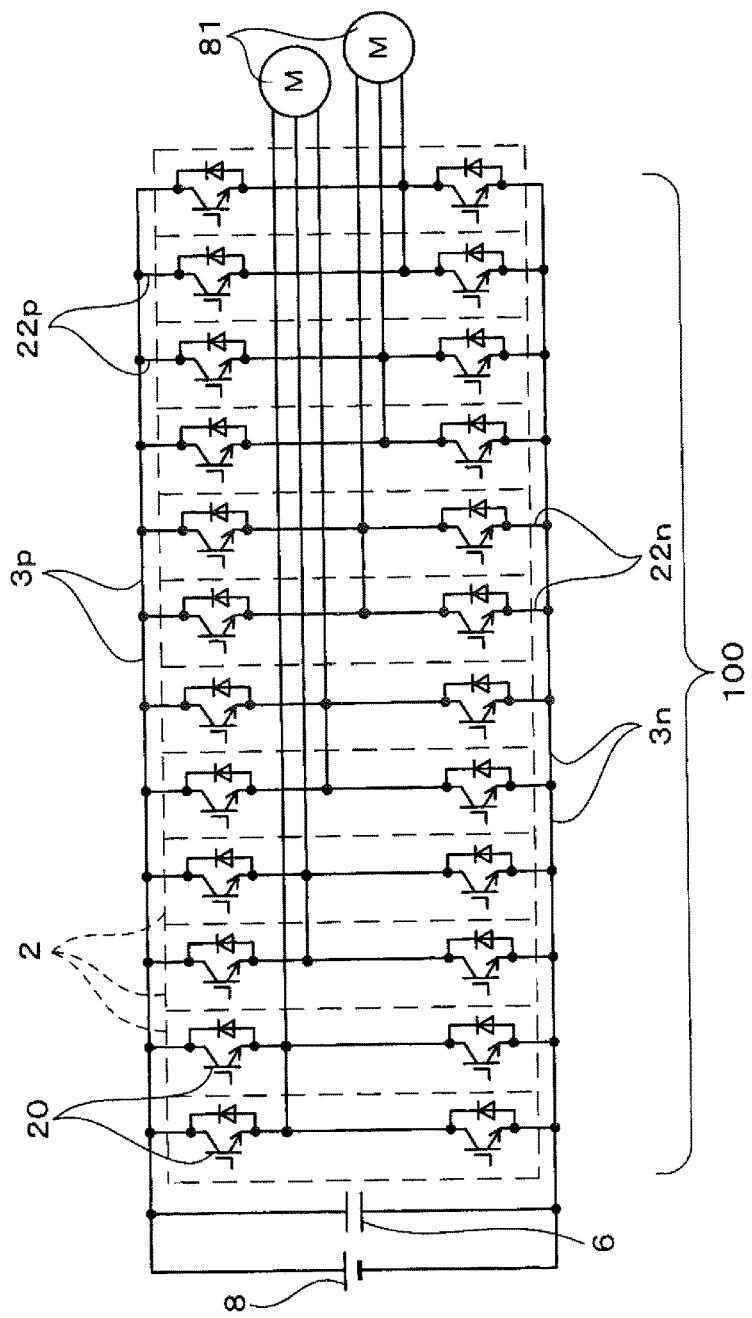
FIG. 16 shows a circuit diagram of the electric power converter in the first embodiment.

As shown in FIG. 16, an inverter circuit 100 is formed by using the plurality of semiconductor modules 2 in the present embodiment.

By switching on/off the semiconductor element 20 (an IGBT element) incorporated in each semiconductor module 2, the DC power supplied from the DC power source 8 is converted into the AC power.

Then, the vehicle is traveled by driving the AC loads 81 (three-phase AC motors) using the AC power obtained.

Figure 5:
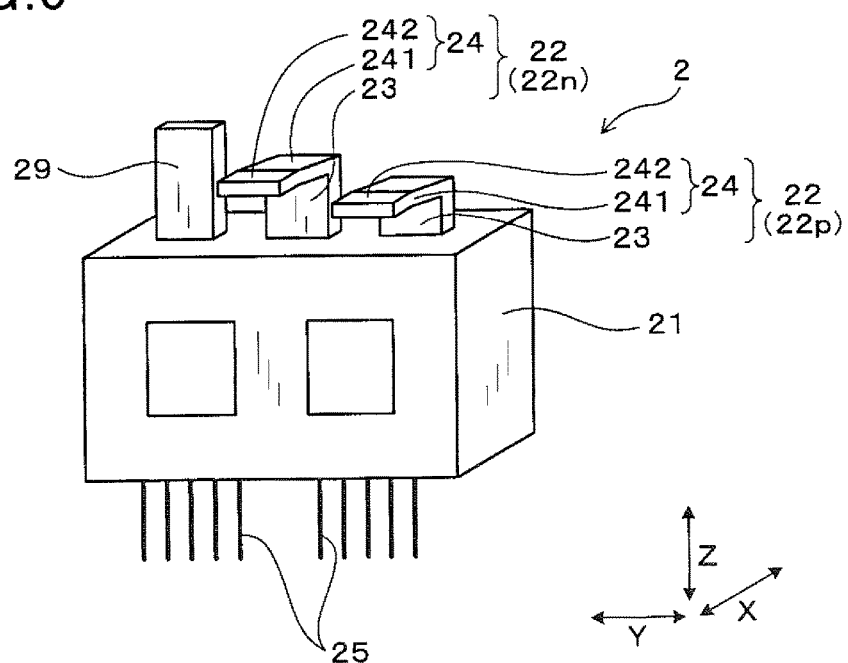
FIG. 5 shows a perspective view of a semiconductor module in the first embodiment.
Figure 6:
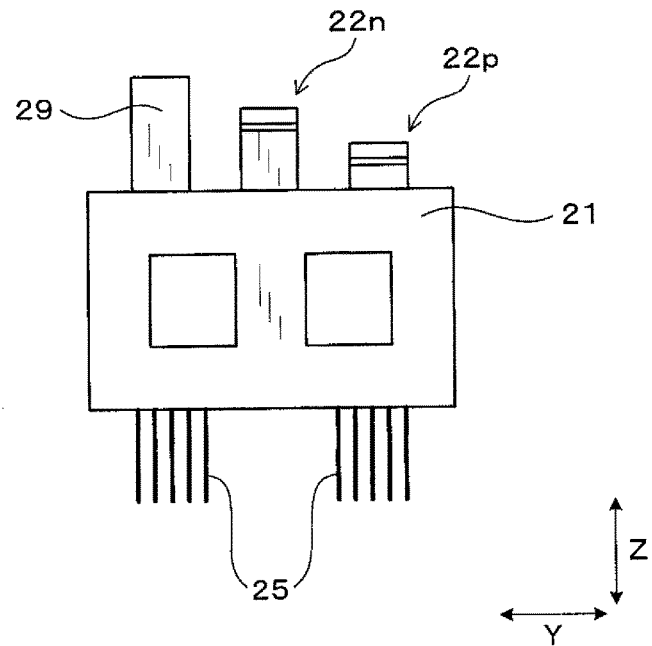
FIG. 6 shows a plan view of the semiconductor module in the first embodiment.

As shown in FIG. 5 and FIG. 6, the DC terminal 22 includes the terminal body portion 23 projecting from the main body portion 21.

Further, the DC terminal 22 includes a bent portion 24 formed by bending a portion in a distal end side of the terminal body portion 23 towards one side in the X direction.

The bent portion 24 is welded to the DC bus bar 3.

In the present embodiment, as shown in FIG. 9, the bent portion 24 is welded to the DC bus bar 3 by irradiating the laser beam L to a position in the bent portion 24 overlapping with the inner surface 31 of the penetrating portion 30 when viewed from the Z direction.

The bent portion 24 includes a first portion 241 connected to a distal end of the terminal body portions 23, and a second portion 242 formed by bending a portion in a distal end side of the first portion 241.

Figure 17:
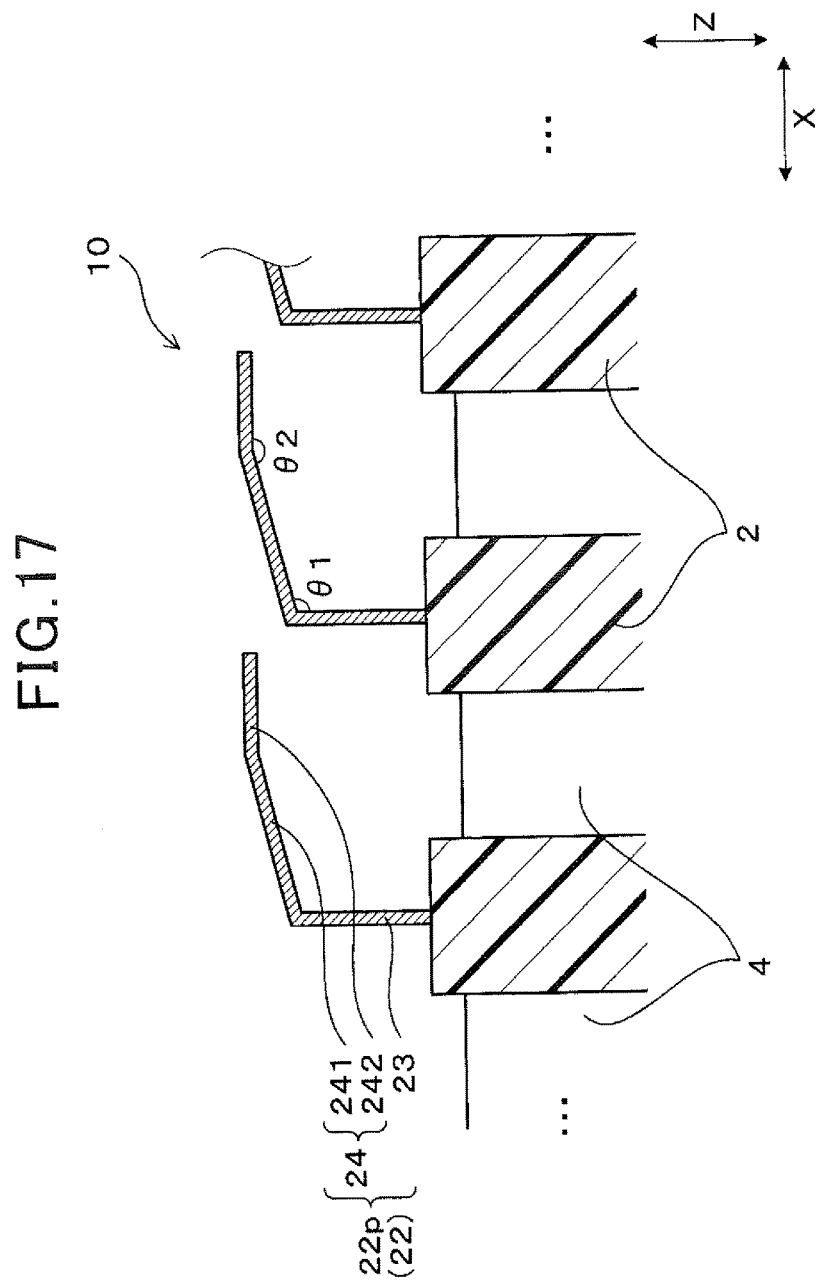
FIG. 17 shows a sectional view of a stacked body in a state where the DC bus bar is not connected in the first embodiment.

As shown in FIG. 17, in a state where the DC bus bar 3 is not in contact with the bent portion 24, an angle θ1 between the first portion 241 and the terminal body portion 23 is an obtuse angle.

Further, the angle θ2 between the second portion 242 and the first portion 241 is also an obtuse angle.

When the DC bus bar 3 is pressed against the bent portion 24, the DC terminal 22 elastically deforms, and the angles θ1, θ2 change.

Figure 11:
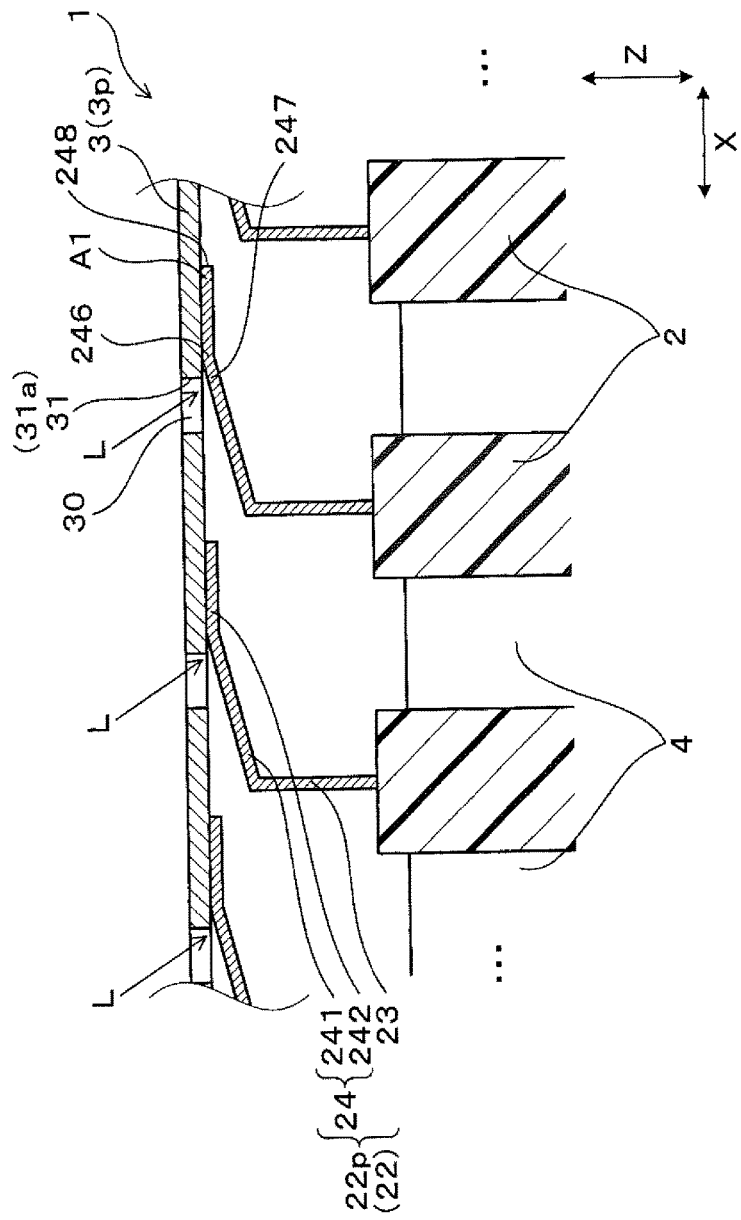
FIG. 11 shows a manufacturing process of the electric power converter in a state where the semiconductor module is not misaligned in the Z direction but is misaligned to the right in the X direction in the drawing than in FIG. 9 in the first embodiment.

As shown in FIG. 9 and FIG. 11, the semiconductor module 2 is misaligned in the Z direction, and it may approach the DC bus bar 3.

In the electric power converter 1 of the present embodiment, in such a case, since the DC terminal 22 elastically deforms, a positional displacement of the semiconductor module 2 in the Z direction is acceptable.

Figure 10:
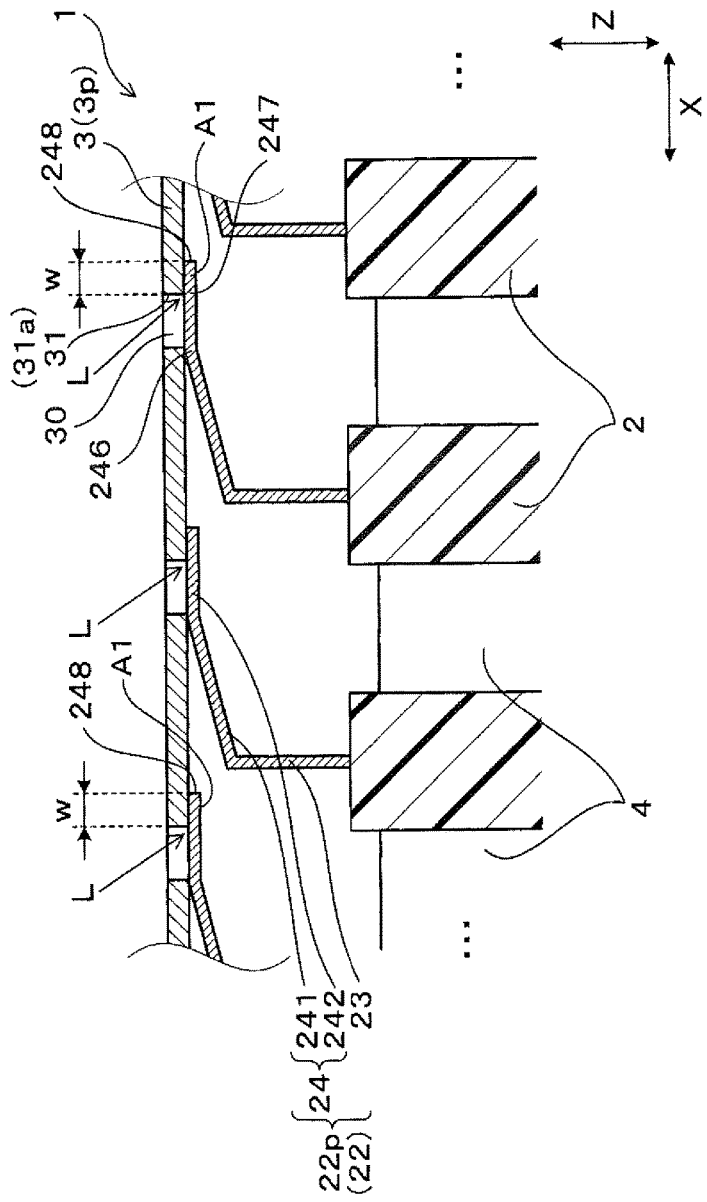
FIG. 10 shows a manufacturing process of the electric power converter in a state where the semiconductor module is not misaligned in a Z direction but is misaligned to the left in an X direction in the drawing than in FIG. 9 in the first embodiment.

Further, as shown in FIGS. 9 to 11, a position of the semiconductor module 2 may be displaced in the X direction.

As shown in FIG. 10, even when the semiconductor module 2 is misaligned in the X direction, an area within a predetermined distance W from a distal end surface 248 of the bent portion 24 (non-welded area A1) always overlaps the DC bus bar 3 in the Z direction, and thus this area will not be welded.

A portion that has been irradiated is likely to melt when irradiating the laser beam L or the like in a vicinity of the distal end surface 248.

Therefore, in the present embodiment, the non-welded area A1 is formed, thereby such a problem is prevented from occurring.

Further, in the present embodiment, as shown in FIGS. 9 to 14, the bent portion 24 is welded to the DC bus bar 3 at a position that overlaps in the Z direction with a proximal inner surface 31a of the inner surface 31 of the penetrating portion 30 that exists closest to the non-welded area A1 in the X direction.

Further, even if the semiconductor module 2 is misaligned in the X and Z directions, at least a part of an intersecting portion 246 where the first portion 241 and the second portion 242 intersect always abuts the DC bus bar 3.

As shown in FIG. 9, when the semiconductor module 2 is not misaligned in either the X direction or the Z direction, the second portion 242 overlaps with the proximal inner surface 31a in the Z direction.

Therefore, the second portion 242 is welded to the DC bus bar 3.

As shown in FIG. 10, even when the semiconductor module 2 is not misaligned in the Z direction but is misaligned to the left in the X direction in the drawing than in FIG. 9, the second portion 242 overlaps with the proximal inner surface 31a in the Z direction.

Therefore, the second portion 242 is welded to the DC bus bar 3.

Further, as shown in FIG. 11, when the semiconductor module 2 is not misaligned in the Z direction but is misaligned to the right in the X direction in the drawing than in FIG. 9, the first portion 241 overlaps with the proximal inner surface 31a in the Z direction.

Therefore, the first portion 241 is welded to the DC bus bar 3.

At this time, a slight gap is formed between a welded portion 247 of the DC terminal 22 and the DC bus bar 3.

Even in this case, it can be sufficiently welded by the laser beam L.

Figure 12:
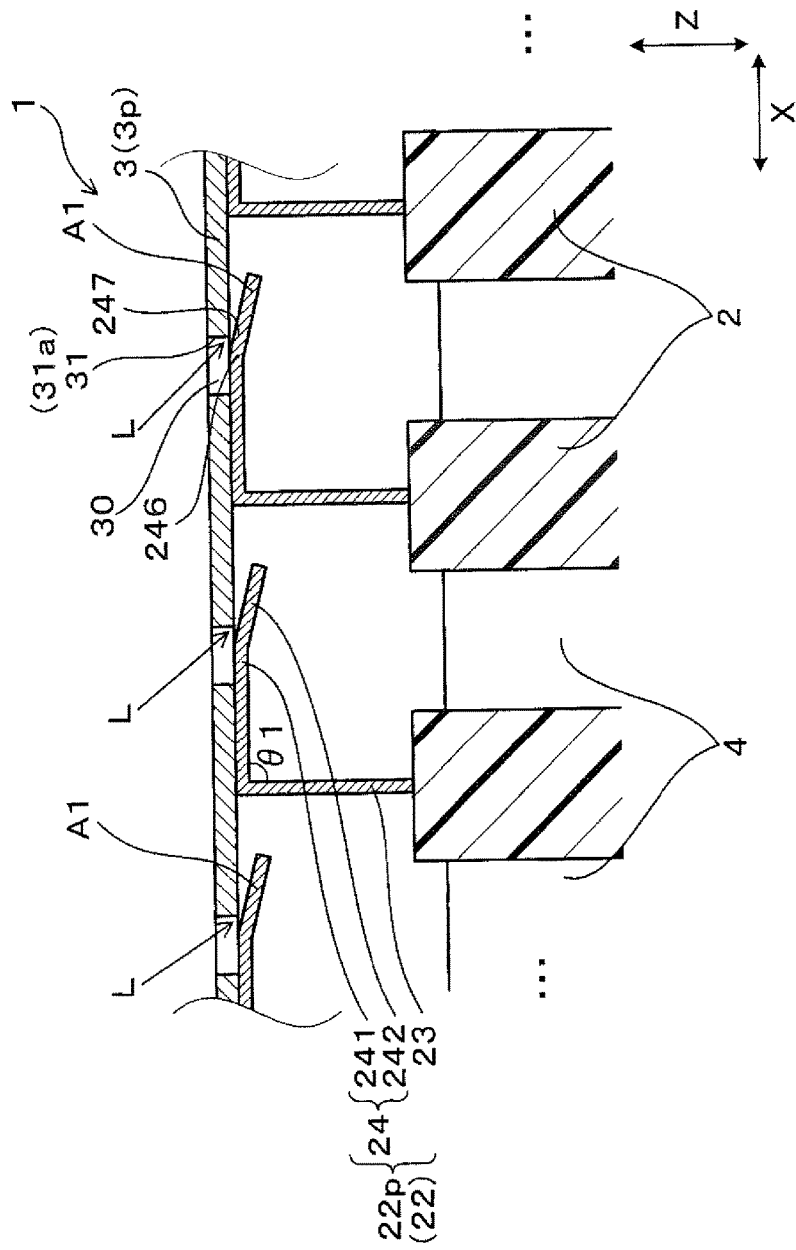
FIG. 12 shows a manufacturing process of the electric power converter in a state where the semiconductor module is misaligned in a direction of approaching to the DC bus bar, but is not misaligned in the X direction in the first embodiment.

Further, as shown in FIG. 12, when the semiconductor module 2 is not misaligned in the X direction but is misaligned towards an upper side in the Z direction in the drawing, the bent portion 24 is to be pressed strongly against the DC bus bar 3.

Thus, the DC terminal 22 elastically deforms, and the angle θ1 between the first portion 241 and the terminal body portions 23 becomes small.

At this time, the second portion 242 overlaps with the proximal inner surface 31a in the Z direction.

Therefore, the second portion 242 is welded to the DC bus bar 3.

At this time, although a gap is formed between the welded portion 247 and the DC bus bar 3, it can be sufficiently welded by the laser beam L even in such a case.

Figure 13:
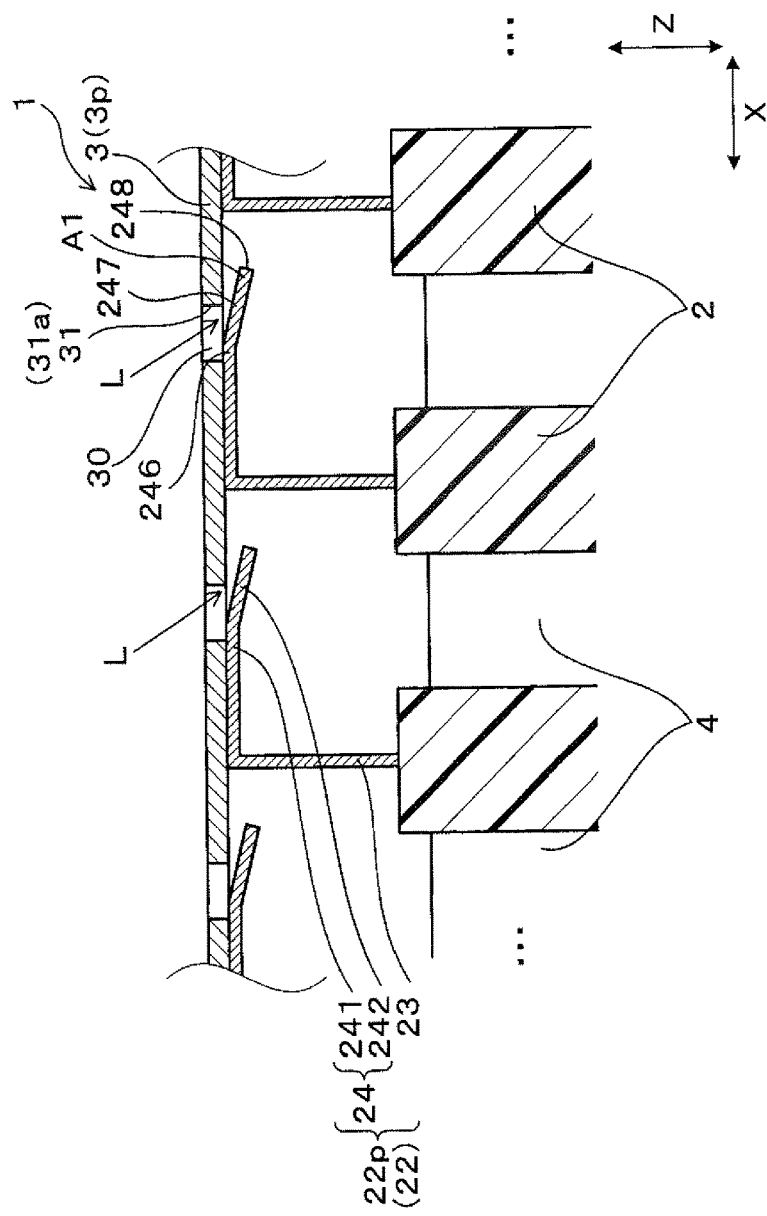
FIG. 13 shows a manufacturing process of the electric power converter in a state where the semiconductor module is misaligned in the direction of approaching to the DC bus bar is misaligned to the left in the X direction in the drawing than in FIG. 12 in the first embodiment.

Further, as shown in FIG. 13, when the semiconductor module 2 is misaligned to the upper side in the Z direction in the drawing, and is misaligned to the left in the X direction in the drawing than in FIG. 12, the second portion 242 overlaps with the proximal inner surface 31a in the Z direction.

Therefore, the second portion 242 is welded to the DC bus bar 3.

At this time, although a gap is formed between the welded portion 247 and the DC bus bar 3, it can be sufficiently welded by the laser beam L even in such a case.

Figure 14:
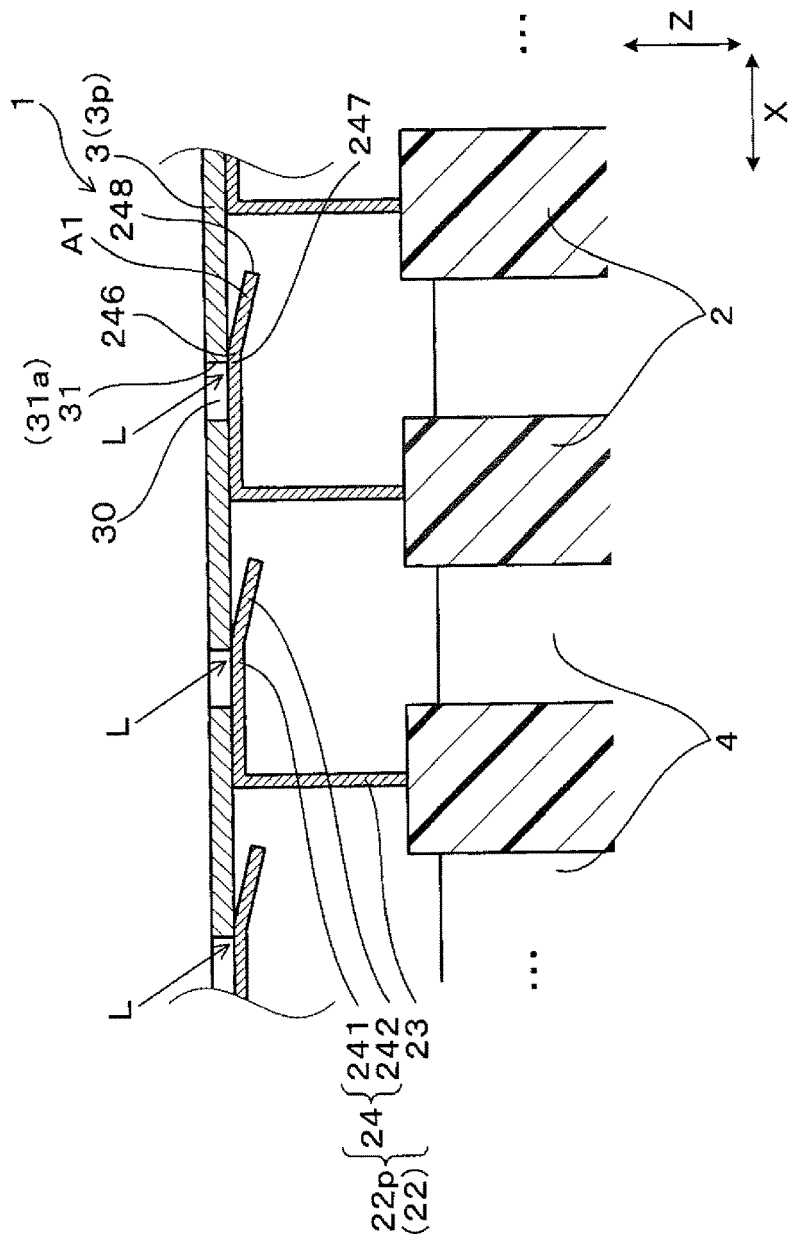
FIG. 14 shows a manufacturing process of the electric power converter in a state where the semiconductor module is misaligned in the direction of approaching to the DC bus bar is misaligned to the right in the X direction in the drawing than in FIG. 12 in the first embodiment.

Further, as shown in FIG. 14, when the semiconductor module 2 is misaligned to the upper side in the Z direction in the drawing, and is misaligned to the right in the X direction in the drawing than in FIG. 12, the first portion 241 overlaps with the proximal inner surface 31a in the Z direction.

Therefore, the first portion 241 is welded to the DC bus bar 3.

Figure 15:
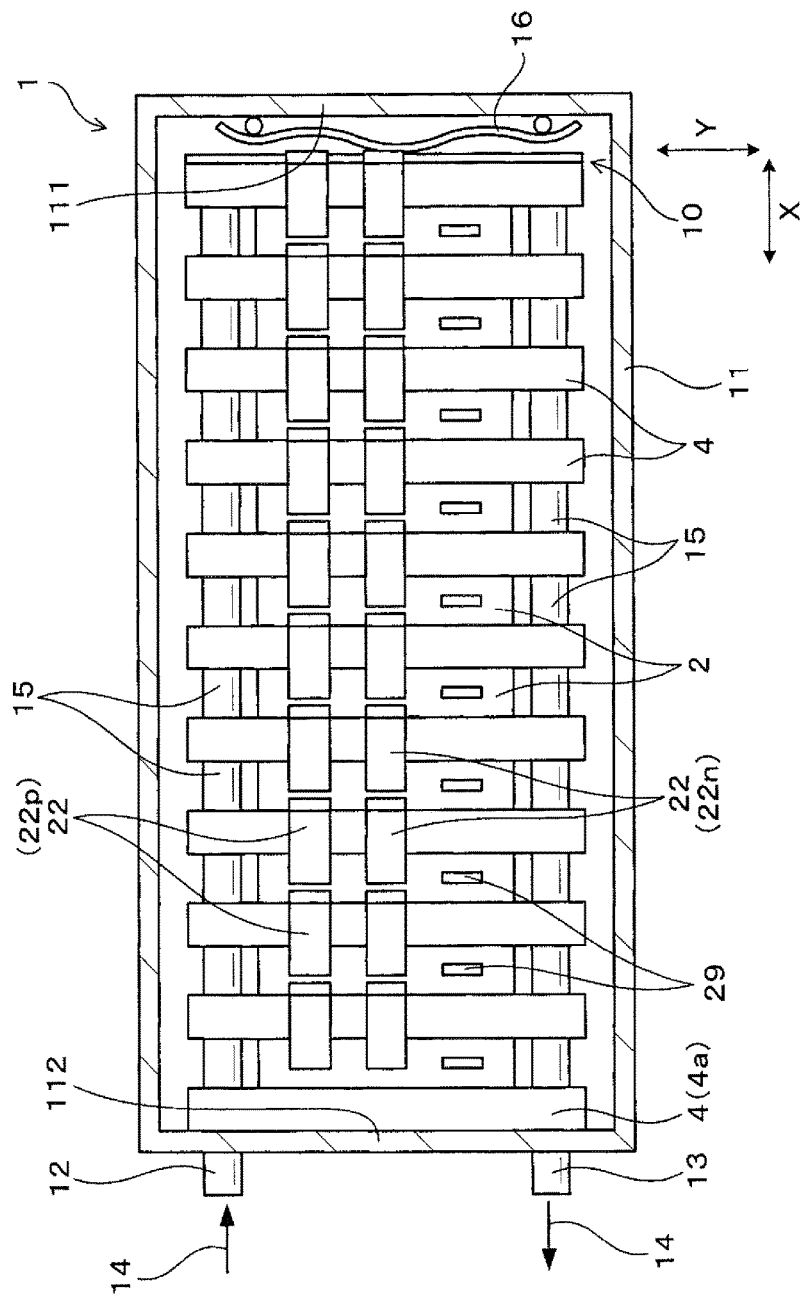
FIG. 15 shows a sectional view of the electric power converter in a state where two DC bus bars are removed in the first embodiment.

On the other hand, as shown in FIG. 15, the stacked to body 10 is accommodated in a metallic casing 11 in the present embodiment.

A pressing member 16 (leaf spring) is disposed between a first wall portion 111 of the case 11 and the stacked body 10.

The stacked body 10 is pressed against a second wall portion 112 of the casing 11 by using the pressing member 16.

Thus, while ensuring a contacting pressure between the semiconductor modules 2 and the cooling pipes 4, the stacked body 10 is fixed in the case 11.

Two cooling pipes 4 adjacent to each other in the X direction are connected by connecting pipes 15 at both ends in the width direction (Y-direction) orthogonal to both the X direction and the Z direction.

Further, an inlet pipe 12 for introducing a refrigerant 14 and an outlet pipe 13 for discharging the refrigerant 14 are attached to an end portion cooling pipe 4a positioned at one end in the X direction among the plurality of cooling pipes 4.

When the refrigerant 14 is introduced from the inlet pipe 12, the refrigerant 14 flows through all of the cooling pipes 4 through the connecting pipes 15, and is discharged from the outlet pipe 13.

Thereby, it is configured to cool the semiconductor modules 2.

Next, the structure of the DC bus bars 3 (3p, 3n) will be described.

Figure 7:
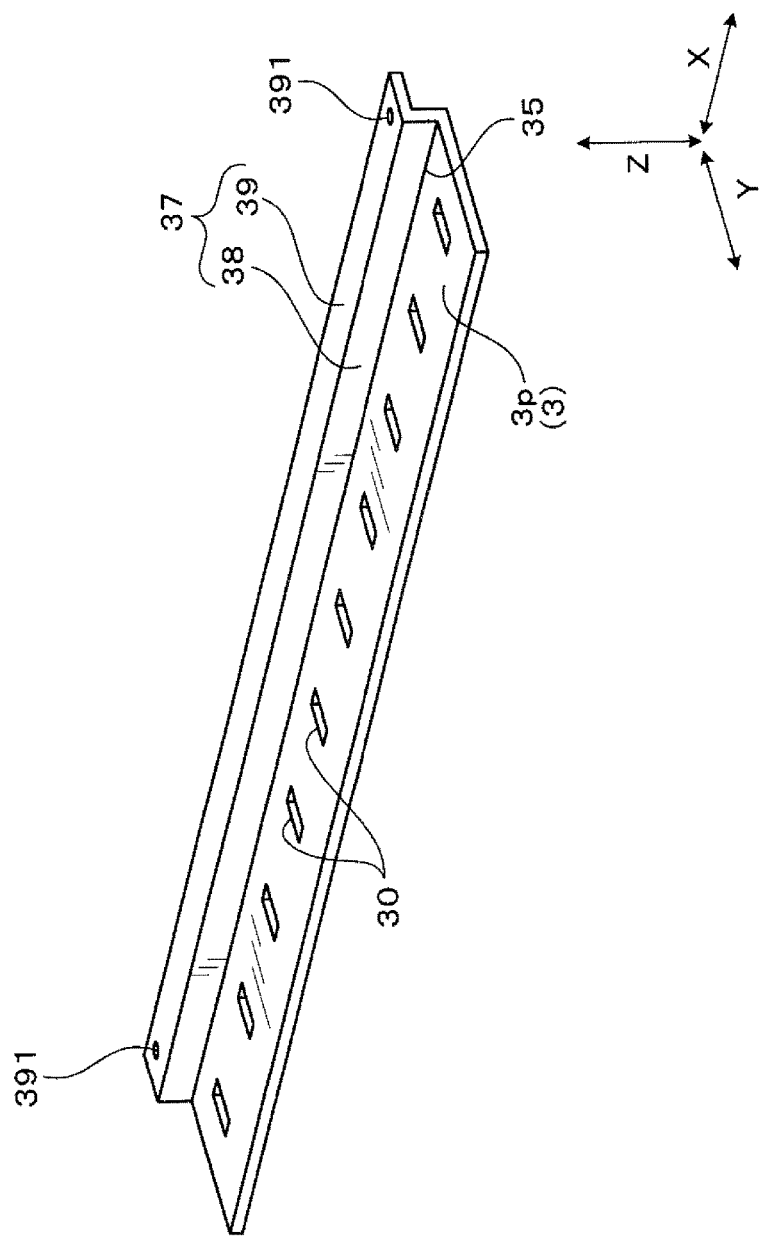
FIG. 7 shows a perspective view of one of the DC bus bars in the first embodiment.
Figure 8:
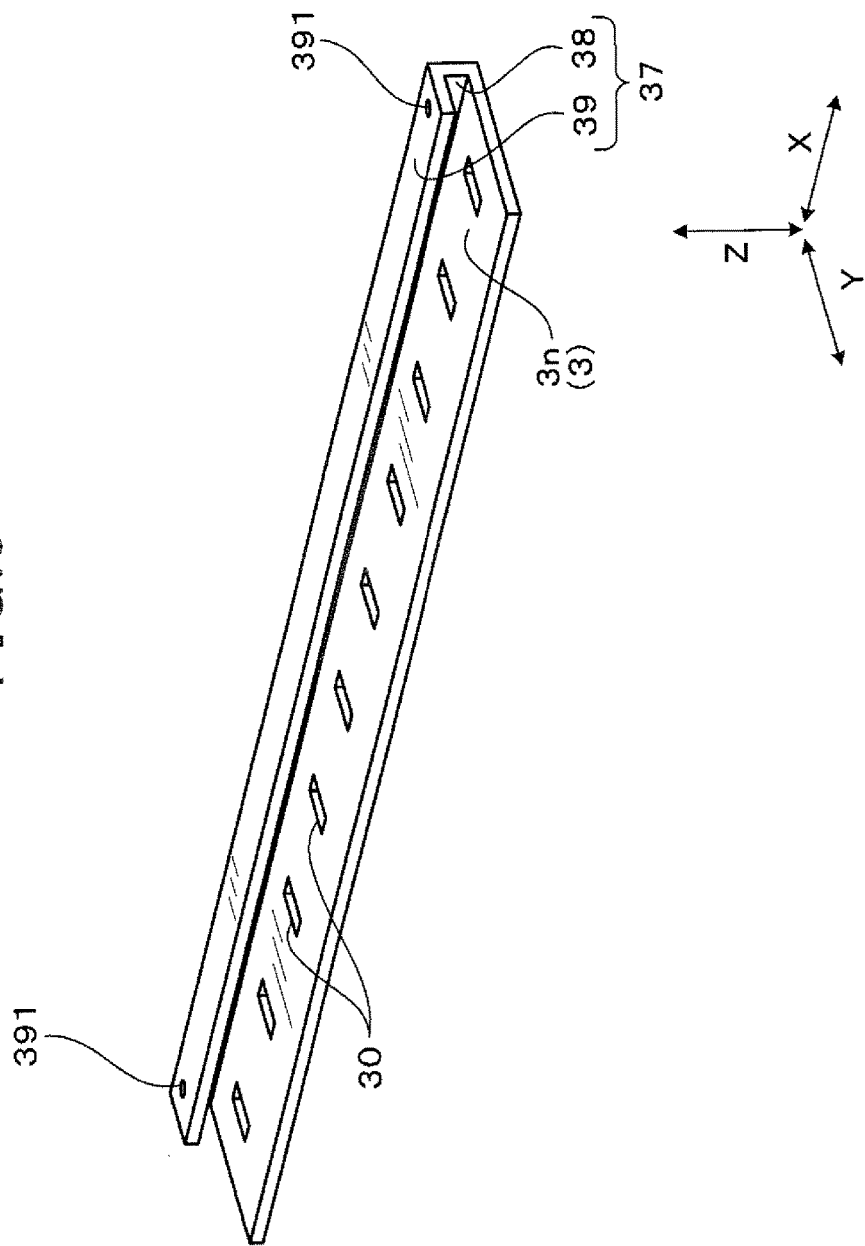
FIG. 8 shows a perspective view of another one of the DC bus bars in the first embodiment.

As shown in FIG. 7 and FIG. 8, connecting portions 37 for connecting with the capacitor 6 (refer to FIG. 4) are formed in the DC bus bars 3 of the present embodiment.

Each of the connecting portions 37 includes a standing portion 38 extending in the Z direction from an edge 35 in the Y direction of the DC bus bar 3, and an extending portion 39 extending in the Y-direction from the standing portion 38.

The standing portion 38 and the extending portion 39 are formed in an elongated shape in the X direction.

Bolt insertion holes 391 are formed at both ends in the X direction of the extending portion 39.

Terminals 61 of the capacitor 6 (refer to FIG. 4) and the extending portions 39 are fastened by overlapping the terminals 61 onto the extending portions 39, and by inserting bolts into the bolt insertion holes 391.

Thereby, the DC bus bars 3 are electrically connected to the capacitor 6.

Functions and effects of the present embodiment are explained.

As shown in FIG. 2, in the present embodiment, the DC bus bar 3 and the DC terminal 22 are connected to each other in the position where the DC bus bar 3 and the DC terminal 22 overlap with the inner surface 31 of the penetrating portion 30 when viewed from the Z direction.

Then, the penetrating portion 30 is formed in the hole shape.

That is, it is configured that surroundings of the penetrating portion 30 is surrounded by a metallic material constituting the DC bus bar 3.

In this way, a portion of the DC terminal 22 to be connected to the DC bus bar 3 will be surrounded by the metallic material constituting the DC bus bar 3.

Therefore, a current I is hardly limited in a vicinity of the portion mentioned above, and it is possible to increase the number of paths where the current I flows in the DC bus bar 3.

Therefore, it is possible to reduce an parasitic inductance of the DC bus bar 3.

That is, the parasitic inductance occurs in each of the current path, and these inductances are connected in parallel to a single DC terminal 22.

Therefore, the number of inductances that are parasitic on each current path that are connected in parallel to each other increases when the number of the current paths increases.

As a result, a combined inductance of the plurality of inductances is reduced.

Therefore, when the semiconductor element 20 is switched, a large surge due to the combined inductance can be suppressed from occurring.

Figure 28:
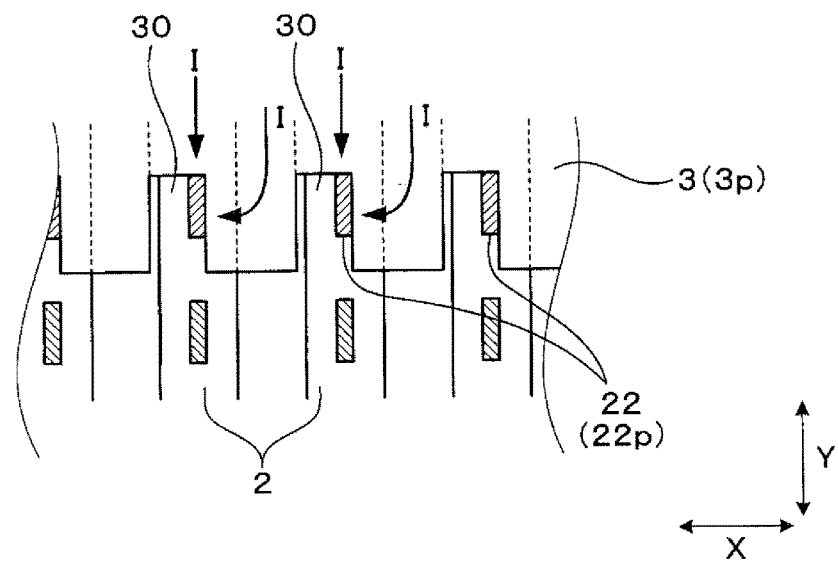
FIG. 28 shows an enlarged sectional view of an electric power converter in a comparative example.

Suppose, as shown in FIG. 28, when the penetrating portion 30 is formed in a shape that opens in the Y-direction, a large inductance tends to parasitic to the DC bus bar 3.

That is, in an example of FIG. 28, since a part of the DC bus bar 3 exists at a position adjacent to a non-opening side of the penetrating portion 30 in the Y direction (upper side in the drawing) with respect to DC terminals 22p, thus the current I flows in this part.

However, since there is no part of the DC bus bar 3 existing in an opening side (lower side in the drawing), it is impossible for the current I to flow through the opening side.

Therefore, the number of paths where the current I flows is small, and a large inductance tends to parasitic on the DC bus bar.

In contrast, as shown in FIG. 2, by forming the penetrating portion 30 into the hole shape as in the present embodiment, the current I can flow on both sides in the Y direction with respect to the DC terminal 22.

Therefore, it is possible to increase the number of the path where the current I flows, thus the inductance parasitic on the DC bus bar 3 can be reduced.

Further, when the above configuration is employed, since it is possible increase the number of the path where the current I flows inside the DC bus bar 3, an electrical resistance of the DC bus bar 3 can be reduced.

Therefore, it is possible to reduce a resistance heat generated from the DC bus bar 3.

Further, since it is possible to broaden an area of the DC bus bar 3, it becomes easy to cool the DC bus bar 3.

Further, as shown in FIG. 1, the stacked body 10 is constituted by stacking the plurality of semiconductor modules 2 and the plurality of cooling pipes 4 in the present embodiment.

Therefore, it is possible to cool the semiconductor module 2 by the cooling pipes 4 from both sides in the X direction, and it is possible to increase a cooling efficiency of the semiconductor module 2.

Further, as shown in FIG. 9, each of the DC terminals 22 includes the terminal body portion 23 and the bent portion 24.

Then, the bent portion 24 is welded to the DC bus bar 3 at a position overlapping with the inner surface 31 of the penetrating portion 30 when viewed from the Z direction.

Since the bent portion 24 is formed by bending the DC terminals 22, the length of the bent portion 24 in the X-direction is longer than the length of the terminal body portions 23 in the X-direction.

Therefore, the inner surface 31 of the penetrating portion 30 and the bent portion 24 can be overlapped in the Z direction even when the length of the penetrating portion 30 in the X-direction is short and the semiconductor module 2 is greatly misaligned in the X direction.

Therefore, even in this case, it is possible to weld the DC terminal 22 to the DC bus bar 3.

Figure 25:
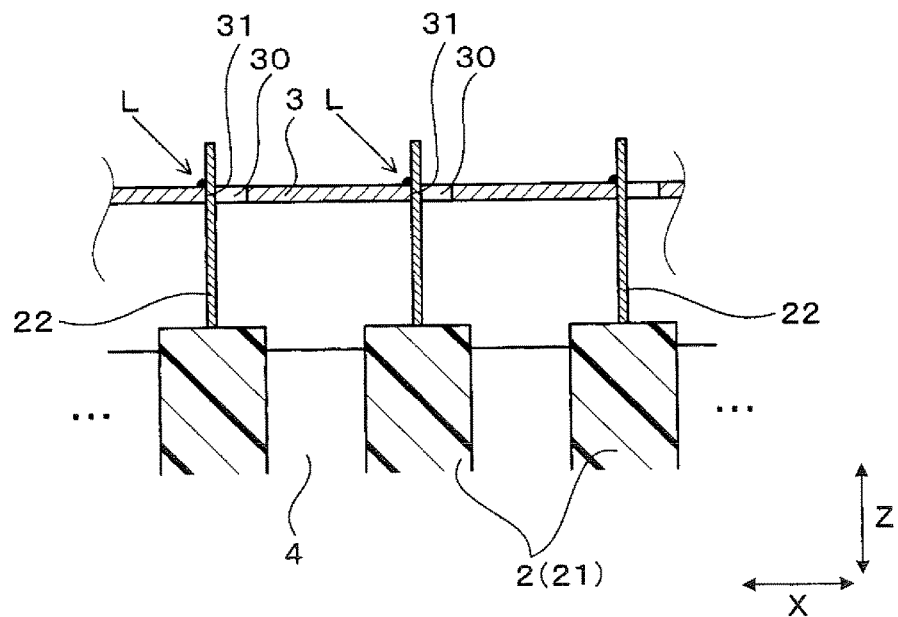
FIG. 25 shows a sectional view of the electric power converter in a fifth embodiment.

Further, as shown in FIG. 25, it is also possible to weld the DC terminal 22 to the DC bus bar 3 by inserting the DC terminals 22 into the penetrating portion 30 without forming the bent portion 24.

However, in this way, it is necessary for the DC terminals 22 to be deformed in the X-direction by increasing the length of the DC terminals 22 in the Z direction so that the semiconductor module 2 can be welded even when it is misaligned in the X direction.

Therefore, a gap in the Z direction between the main body portion 21 and the DC bus bar 3, thus the electric power converter 1 tends to be large.

In contrast, the DC terminal 22 is deformed in the X direction by forming the bent portion 24 in the present embodiment, and welding the bent portion 24 to the DC bus bar 3 at the position overlapping with the inner surface 31 of the penetrating portion 30 when viewed in the Z direction.

Therefore, it is possible to shorten the length of the DC terminals 22 in the X-direction.

Therefore, it is possible to narrow the gap in the Z direction between the DC bus bar 3 and the main body portion 21, thus the electric power converter 1 can be downsized.

Further, as shown in FIG. 10, the area existing within the predetermined distance W in the X direction from the distal end surface 248 of the bent portion 24 in the bent portion 24 is the non-welded area A1 that will not be welded to the DC bus bar 3.

As shown in FIG. 9 and FIG. 10, the non-welded area A1 overlaps with the DC bus bar 3 in the Z direction.

Then, the bent portion 24 is welded to the DC bus bar 3 at the position that overlaps in the Z direction with a proximal inner surface 31a of the inner surface 31 of the penetrating portion 30 that exists closest to the non-welded area A1 in the X direction.

In this way, defects due to the laser beam L or the like irradiated in the vicinity of the distal end surface 248 where the irradiated portion melts can be suppressed from occurring.

Further, as shown in FIG. 9 and FIG. 10, the bent portion 24 includes the first portion 241 and the second portion 242.

The non-welded area A1 is formed in the second portion 242.

Further, the intersecting portion 246 is adapted to abut at least the DC bus bar 3.

In this way, it becomes easy to perform an operation of welding the bent portion 24 and the DC bus bar 3.

Figure 24:
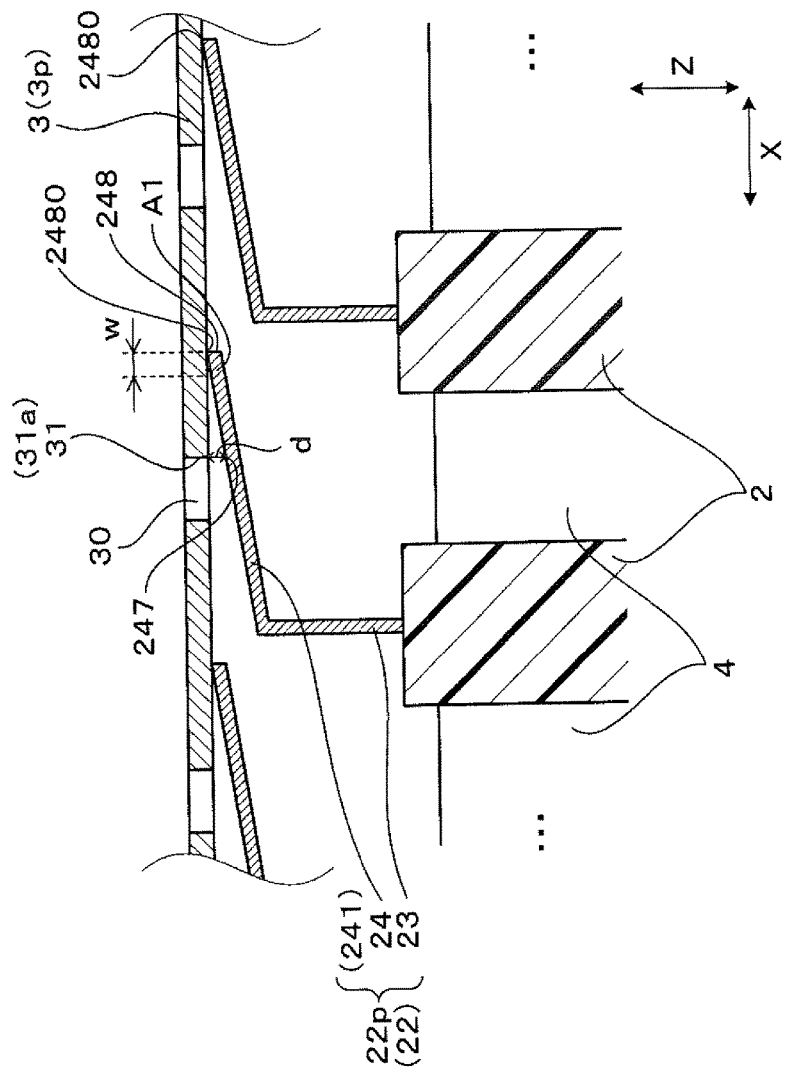
FIG. 24 shows an enlarged sectional view of the electric power converter in a fourth embodiment.

That is, as shown in FIG. 24, it is also possible to form only the first portion 241 to the bent portion 24 without forming the second portion 242.

However, in this case, a distal end 2480 of the bent portion 24 abuts on the DC bus bar 3.

Therefore, the non-weld area A1 will exist between a portion (distal end 2480) abutting to the DC bus bar 3 and the welded portion 247 in the bent portion 24, thus the length from the distal end 2480 to the welded portion 247 in the X-direction becomes longer.

Therefore, the distance d in the Z direction between the DC bus bar 3 and the welded portion 247 is broadened, thus it is possible that performing the welding operation becomes difficult.

In particular, the distance d is broadened when the semiconductor module 2 is misaligned to the right in the X direction in the drawing, thus it becomes difficult to perform the welding operation.

In contrast, as shown in FIG. 11, by employing the configuration of the present embodiment, the non-weld area A1 will not be disposed between the part that abuts the DC bus bar 3 (intersecting portion 246) and the welded portion 247 in the bent portion 24.

Therefore, the length from the part that abuts the DC bus bar 3 (intersecting portion 246) to the welded portion 247 in the X-direction can be shortened.

Therefore, it is possible to narrow the distance between the DC bus bar 3 and the welded portion 247 in the Z direction, thus it becomes possible to easily perform the welding operation.

As shown in FIG. 11, it is possible to sufficiently narrow the distance mentioned above even when the semiconductor module 2 is misaligned to the right in the X direction in the drawing, and it is possible to easily perform the welding operation.

Further, as shown in FIGS. 2 and 9, the plurality of penetrating portions 30 are formed in the DC bus bars 3p, 3n of the present embodiment.

The respective penetrating portion 30 is formed at a position corresponding to the respective DC terminal 22.

In this way, an interposed portion 390 is formed between the two penetrating portions 30 adjacent in the X-direction.

The interposed portion 390 exists at a position adjacent to the bent portion 24 in the Z direction.

Further, as shown in FIG. 2, the current I flows through the bent portion 24 so as to wrap around the bent portion 24 toward the penetrating portion 30.

Therefore, as shown in FIG. 9, a part of the current flows in the interposed portion 390 in a direction opposite to a direction of the current I flowing through the bent portion 24.

Therefore, a magnetic field generated by the current I flowing through the interposed portion 390 and a magnetic field generated by the current I flowing through the bent portion 24 cancel each other, thus it is possible to reduce the inductance parasitic on the DC terminal 22.

Further, as shown in FIG. 2, the length of the penetrating portion 30 in the X-direction is set shorter than the length of the DC terminals 22 in the X-direction in the present embodiment.

Therefore, it is possible to increase the length of the interposed portion 390 in the X-direction.

Therefore, it is possible to increase an amount of current I flowing through the interposed portion 390, thus the inductance parasitic on the DC terminal 22 can be further reduced.

As described above, according to the present embodiment, it is possible to provide an electric power converter that can further reduce the parasitic inductance of the DC bus bar.

Second Embodiment

It should be appreciated that, in the second embodiment and the subsequent embodiments, components identical with or similar to those in the first embodiment are given the same reference numerals, and repeated structures and features thereof will not be described in order to avoid redundant explanation.

The present embodiment is an example where a shape of a penetrating portion 30 is changed.

Figure 18:
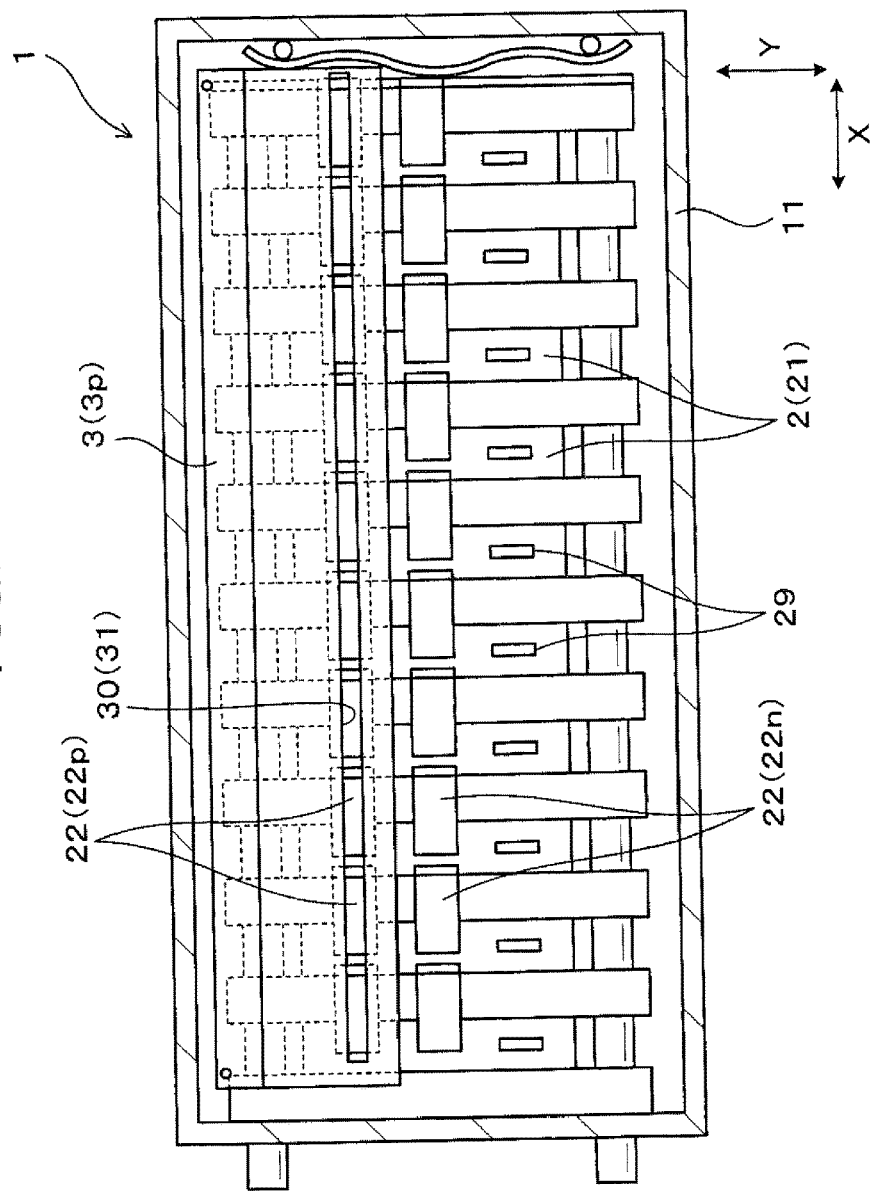
FIG. 18 shows a sectional view of an electric power converter in a state of mounting only one of DC bus bars in a second embodiment.
Figure 19:
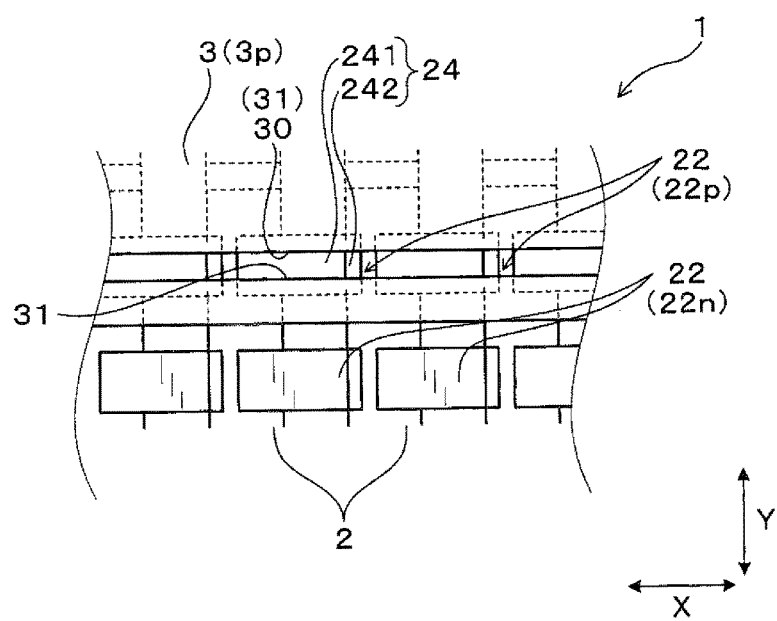
FIG. 19 shows an enlarged view of a principal part of FIG. 18.
Figure 20:
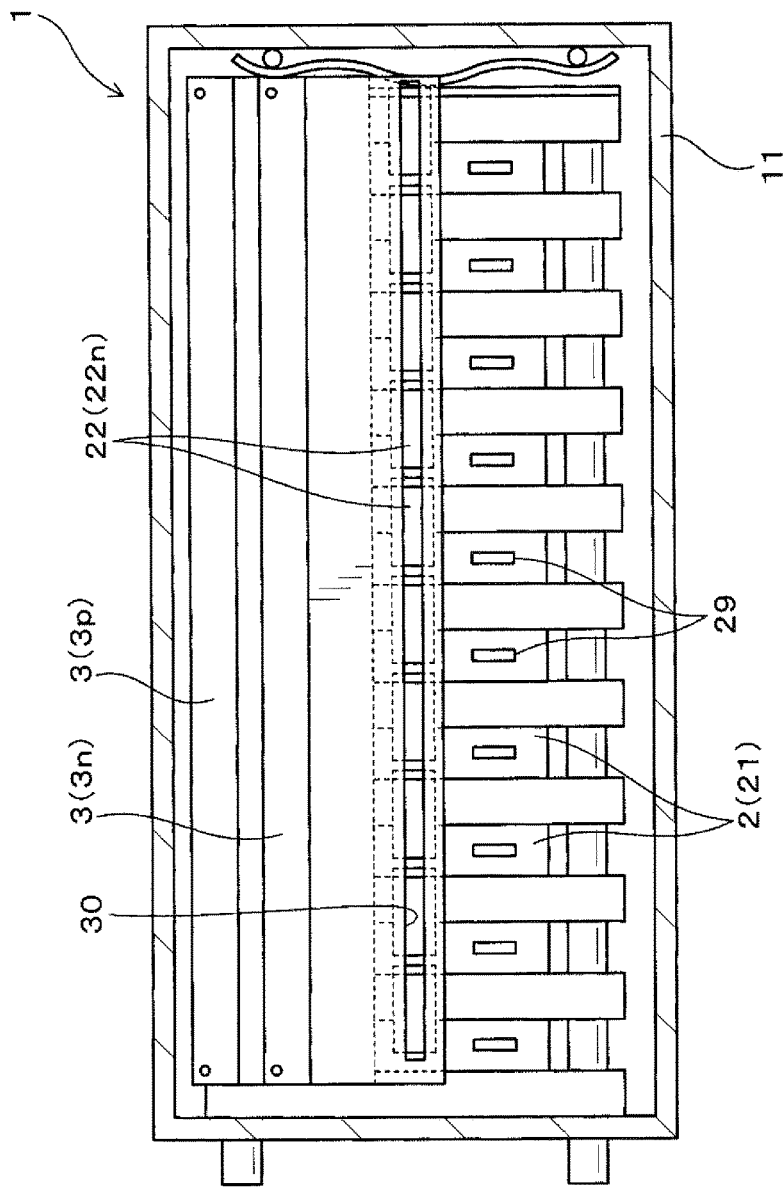
FIG. 20 shows a sectional view of the electric power converter in a state of mounting two DC bus bars in the second embodiment.

As shown in FIGS. 18 to 20, in the present embodiment, a penetrating portion 30 is formed in an elongated shape such that a plurality of DC terminals 22 can be seen from a single penetrating portion 30 when viewed from the Z direction.

In the same manner as in the first embodiment, a bent portion 24 is formed in the DC terminal 22.

The length of the penetrating portion 30 in the Y-direction is shorter than the length of the DC terminal 22 in the Y-direction.

In the present embodiment, the bent portion 24 is welded to the DC bus bar 3 at a position overlapping with an inner surface 31 of the penetrating portion 30 in the Z direction.

Functions and effects of the present embodiment are explained.

When the above configuration is employed, it is possible to reduce the number of the penetrating portions 30.

Therefore, it becomes possible to easily produce the DC bus bar 3.

Other than that, the present embodiment is provided with the same configuration and effects as in the first embodiment.

Third Embodiment

The present embodiment is an example where shapes of a penetrating portion 30 and a DC terminal 22 are changed.

Figure 21:
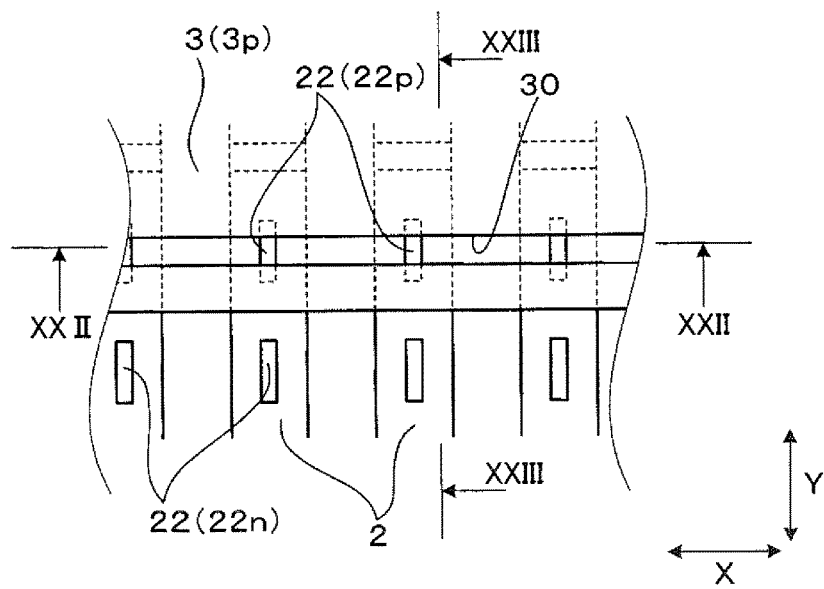
FIG. 21 shows an enlarged view of a principal part of the electric power converter in a third embodiment.

As shown in FIG. 21, in the present embodiment, a penetrating portion 30 is formed into an elongated shape in the same manner as in the second embodiment so that a plurality of DC terminals 22 can be seen from a single penetrating portion 30 when viewed from the Z direction.

Figure 22:
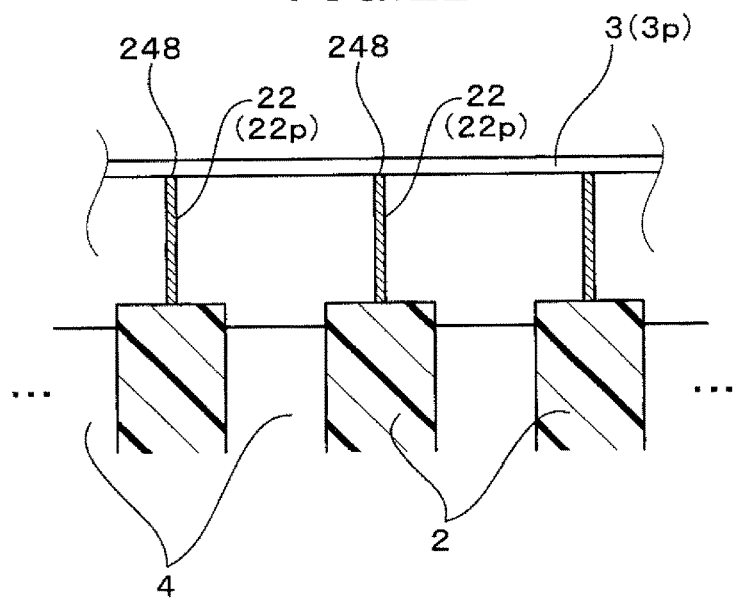
FIG. 22 shows a sectional view taken along a line XXII-XXII of FIG. 21.
Figure 23:
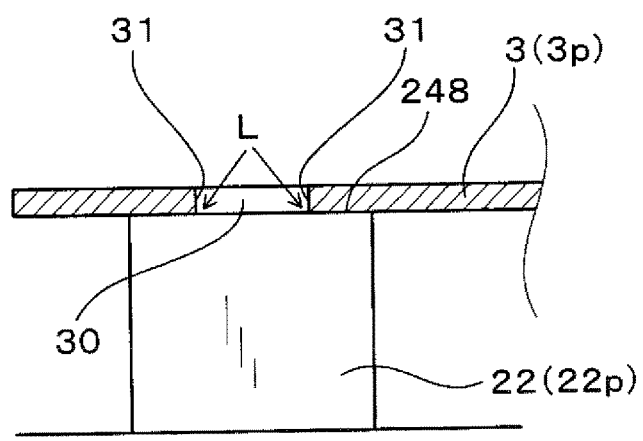
FIG. 23 shows a sectional view taken along a line XXIII-XXIII of FIG. 21.

Further, as shown in FIGS. 21 to 23, the present embodiment is different from the first embodiment in that a bent portion 24 is not formed in the DC terminal 22.

The length of the penetrating portion 30 in the Y-direction is shorter than the length of the DC terminal 22 in the Y-direction.

In the present embodiment, the DC terminal 22 is welded to the DC bus bar 3 by irradiating a laser beam L to a distal end surface 248 of the DC terminal 22.

Other than that, the present embodiment is provided with the same configuration and effects as in the first embodiment.

Fourth Embodiment

The present embodiment is an example where a shape of a DC terminal 22 is changed.

As shown in FIG. 24, the DC terminals 22 of the present embodiment includes a terminal body portion 23, and a bent portion 24 that is formed by bending a portion in a distal end side of the terminal body portion 23.

Unlike the first embodiment, only the first portion 241 is formed in the bent portion 24 of the present embodiment not, and the second portion 242 (refer to FIG. 9) is not formed.

Further, in the same manner as in the first embodiment, an area existing within a predetermined distance in the X-direction from a distal end surface 248 of the bent portion 24 in the bent portion 24 is a non-welded area A1 that will not be welded.

The bent portion 24 is welded to the DC bus bar 3 at a position that overlaps in the Z direction with a proximal inner surface 31a of the inner surface 31 of the penetrating portion 30 that exists closest to the non-welded area A1 in the X direction.

Other than that, the present embodiment is provided with the same configuration and effects as in the first embodiment.

Fifth Embodiment

The present embodiment is an example where a shape of a DC terminal 22 is changed.

As shown in FIG. 25, a bent portion 24 is not formed in a DC terminal 22 in the present embodiment.

In the present embodiment, the DC terminal 22 is inserted into a penetrating portion 30, and the DC terminal 22 is brought into contact with an inner surface 31 of the penetrating portion 30.

In this state, the DC terminal 22 is welded to a DC bus bar 3.

The DC terminal 22 and DC bus bar 3 are connected to each other in a position where the DC bus bar 3 and the DC terminal 22 overlap with an inner surface 31 of the penetrating portion 30 when viewed from the Z direction.

Other than that, the present embodiment is provided with the same configuration and effects as in the first embodiment.

Sixth Embodiment

The present embodiment is an example where shapes of a DC bus bar 3 and a DC terminal 22 are changed.

Figure 26:
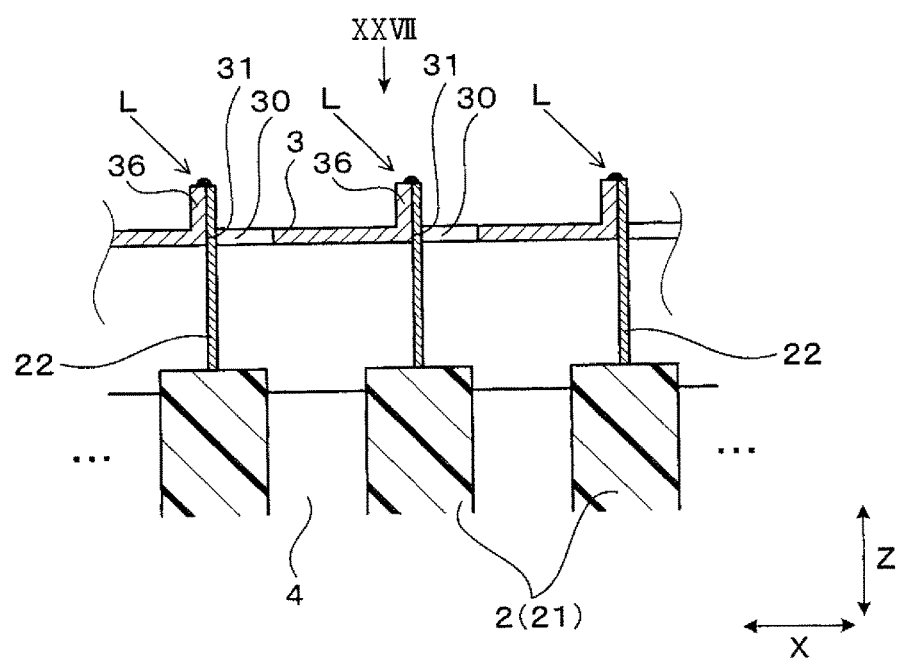
FIG. 26 shows a sectional view of the electric power converter in a sixth embodiment.
Figure 27:
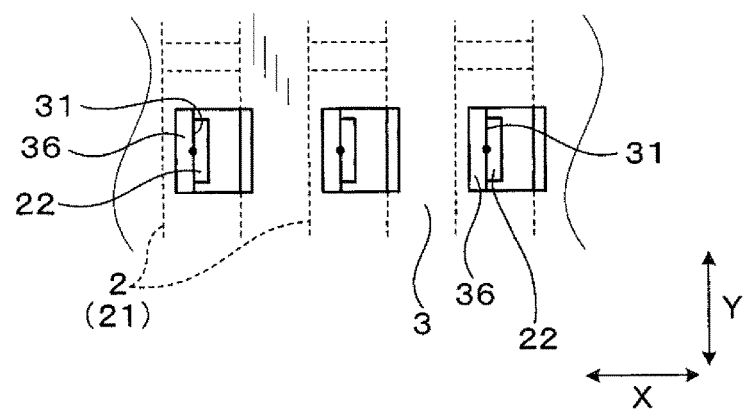
FIG. 27 shows a plan view seen from an arrow XXVII of FIG. 26.

As shown in FIG. 26 and FIG. 27, the DC bus bar 3 of the present embodiment is provided with a projection 36 that projects in the Z direction.

Unlike the first embodiment, a bent portion 24 is not formed in the DC terminals 22 of the present embodiment.

The DC terminal 22 is inserted into a penetrating portion 30, and the DC terminal 22 is brought into contact with an inner surface 31 of the penetrating portion 30.

Then, the projection 36 is welded to the DC terminal 22 by irradiating a laser beam L on a distal end surface of the projection 36 and a distal end surface of the DC terminal 22.

The DC terminal 22 and DC bus bar 3 are connected to each other in a position where the DC bus bar 3 and the DC terminal 22 overlap with an inner surface 31 of the penetrating portion 30 when viewed from the Z direction.

Other than that, the present embodiment is provided with the same configuration and effects as in the first embodiment.

What is claimed is:

1. An electric power converter comprising:
   a semiconductor module including a main body portion having a built-in semiconductor element therein and a DC terminal to which a DC voltage is applied projecting from the main body portion; and
   a DC bus bar connected to the DC terminal; wherein
   the DC bus bar is disposed such that a thickness direction of the DC bus bar matches a projecting direction of the DC terminal;
   a penetrating portion penetrating in the projecting direction is formed in the DC bus bar;
   the DC bus bar and the DC terminal are connected to each other in a position where the DC bus bar and the DC terminal overlap with an inner surface of the penetrating portion when viewed from the projecting direction;
   the penetrating portion is formed in a hole shape;
   a stacked body is constituted by stacking a plurality of semiconductor modules and a plurality of cooling pipes for cooling the semiconductor modules in a thickness direction of a terminal body portion of the DC terminal, the terminal body portion is projecting from the main body portion;
   the DC terminal includes the terminal body portion and a bent portion formed by bending a portion in a distal end side of the terminal body portion towards one side in the thickness direction of the terminal body portion; and
   the bent portion is welded to the DC bus bar.

2. The electric power converter according to claim 1, wherein an area existing within a predetermined distance in the thickness direction of the terminal body portion from a distal end surface of the bent portion in the bent portion is a non-welded area that will not be welded to the DC bus bar;

the non-welded area overlaps with the DC bus bar in the projecting direction; and the bent portion is welded to the DC bus bar at a position that overlaps in the projecting direction with a proximal inner surface of the inner surface of the penetrating portion that exists closest to the non-welded area in the thickness direction of the terminal body portion.

3. The electric power converter according to claim 2, wherein the bent portion includes a first portion connected to a distal end of the terminal body portion and a second portion formed by bending a portion in a distal end side of the first portion;

the non-welded area is formed in the second portion; and an intersecting portion where the first portion and the second portion intersect is adapted to abut at least the DC bus bar.

4. The electric power converter according to claim 1, wherein the DC bus bar has a plurality of penetrating portions formed in positions corresponding to respective DC terminals.

5. The electric power converter according to claim 4, wherein a length of the penetrating portion in the thickness direction of the terminal body portion is shorter than a length of the DC terminal in the thickness direction of the terminal body portion.

6. The electric power converter according to claim 1, wherein the penetrating portion is formed in a shape such that a plurality of DC terminals disposed in the thickness direction of the terminal body portion can be seen from a single penetrating portion when viewed from the projecting direction; and a length of the penetrating portion is shorter than a length of the DC terminal in a width direction perpendicular to both the projecting direction and the thickness direction of the terminal body portion.

7. The electric power converter according to claim 1, wherein the DC bus bar completely surrounds the penetrating portion in a plane perpendicular to the thickness direction of the DC bus bar.

* * * * *